(12) United States Patent
Kim et al.

(10) Patent No.: US 11,972,762 B2
(45) Date of Patent: Apr. 30, 2024

(54) ELECTRONIC APPARATUS AND CONTROLLING METHOD THEREOF

(71) Applicant: SAMSUNG ELECTRONICS CO., LTD., Suwon-si (KR)

(72) Inventors: Shina Kim, Suwon-si (KR); Jongjin Park, Suwon-si (KR); Wonjae Lee, Suwon-si (KR); Minsup Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 217 days.

(21) Appl. No.: 17/419,891

(22) PCT Filed: Dec. 26, 2019

(86) PCT No.: PCT/KR2019/018470
§ 371 (c)(1),
(2) Date: Jun. 30, 2021

(87) PCT Pub. No.: WO2020/141794
PCT Pub. Date: Jul. 9, 2020

(65) Prior Publication Data
US 2022/0084519 A1    Mar. 17, 2022

(30) Foreign Application Priority Data
Jan. 3, 2019    (KR) .................... 10-2019-0000932

(51) Int. Cl.
*G10L 15/22*    (2006.01)
*G06F 3/16*    (2006.01)
(Continued)

(52) U.S. Cl.
CPC .............. *G10L 15/22* (2013.01); *G08C 17/00* (2013.01); *G10L 15/08* (2013.01); *G10L 25/18* (2013.01);
(Continued)

(58) Field of Classification Search
CPC ......... G10L 15/22; G10L 15/08; G10L 15/20; G10L 15/26; G10L 15/00; G10L 25/18;
(Continued)

(56) References Cited

U.S. PATENT DOCUMENTS 5,305,421 A * 4/1994 Li .................... G10L 19/0018
704/262
5,983,186 A * 11/1999 Miyazawa .............. G10L 15/26
704/E15.045
(Continued)

FOREIGN PATENT DOCUMENTS

CN    104848478        5/2015
CN    107464564 A *  12/2017 ........... G10L 15/063
(Continued)

OTHER PUBLICATIONS

Extended European Search Report dated Nov. 5, 2021 in EP Application No. 19908039.1.
(Continued)

*Primary Examiner* — Leshui Zhang
(74) *Attorney, Agent, or Firm* — Nixon & Vanderhye, P.C.

(57) ABSTRACT

An electronic apparatus is provided. The electronic apparatus includes a microphone, a communication interface including circuitry and a processor configured to, based on identifying that a trigger word is included in a first sound signal received through the microphone, enter a voice recognition mode, identify a gain value for adjusting an intensity of the first sound signal to be in a predetermined intensity range based on the intensity of the first sound, adjust an intensity of a second sound signal received through the microphone in the voice recognition mode based on the identified gain value, and control the communication interface to transmit a user command obtained based on voice
(Continued)

recognition regarding the adjusted second sound signal, to an external apparatus.

13 Claims, 10 Drawing Sheets

(51) Int. Cl.
    *G08C 17/00*     (2006.01)
    *G10L 15/08*     (2006.01)
    *G10L 21/0208*     (2013.01)
    *G10L 21/0316*     (2013.01)
    *G10L 25/18*     (2013.01)
    *G10L 25/51*     (2013.01)

(52) U.S. Cl.
    CPC .......... *G10L 25/51* (2013.01); *G08C 2201/31* (2013.01); *G10L 2015/088* (2013.01); *G10L 2015/223* (2013.01)

(58) Field of Classification Search
    CPC . G10L 25/51; G10L 21/0316; G10L 21/0208; G10L 21/02; G10L 2021/02082; G06F 3/165; G06F 3/16; G06F 3/167; G06F 21/32; H03G 3/02; H03G 3/3005; H03G 3/30; H03G 7/007; H03G 7/00; G08C 17/00; G08C 17/02; G08C 2201/31; G08C 23/04
    USPC ....... 704/275, 226, 225, 235, 238, 246, 247, 704/271, 272; 381/92, 93, 94.8, 95, 100, 381/101, 102, 103, 104, 105, 106, 107, 381/108, 109, 110, 111, 112, 113, 114, 381/115, 120, 122; 700/94
    See application file for complete search history.

(56) References Cited

U.S. PATENT DOCUMENTS

| | | | |
|---|---|---|---|
| 9,093,970 | B2 | 7/2015 | Sugita et al. |
| 9,799,349 | B2 | 10/2017 | Mortazavi et al. |
| 10,147,439 | B1 | 12/2018 | Kristjansson et al. |
| 10,418,027 | B2 | 9/2019 | Ko et al. |
| 10,489,111 | B2 | 11/2019 | Jeong |
| 10,579,327 | B2 | 3/2020 | Kagoshima |
| 11,372,619 | B2 | 6/2022 | Jeong |
| 11,385,861 | B2 | 7/2022 | Jeong |
| 2009/0079611 | A1 | 3/2009 | Hwang et al. |
| 2014/0163978 | A1* | 6/2014 | Basye ............... G10L 15/28 704/233 |
| 2015/0039305 | A1 | 2/2015 | Huang |
| 2015/0221302 | A1 | 8/2015 | Han et al. |
| 2016/0314805 | A1* | 10/2016 | Mortazavi ............ G10L 21/034 |
| 2016/0351197 | A1 | 12/2016 | Tan |
| 2018/0097493 | A1* | 4/2018 | Weksler ................ H04R 3/04 |
| 2018/0102125 | A1 | 4/2018 | Ko et al. |
| 2018/0275951 | A1 | 9/2018 | Kagoshima |
| 2018/0285065 | A1 | 10/2018 | Jeong |
| 2020/0057606 | A1 | 2/2020 | Jeong |
| 2020/0057607 | A1 | 2/2020 | Jeong |

FOREIGN PATENT DOCUMENTS

| | | |
|---|---|---|
| GB | 2537694 | 10/2016 |
| JP | 5817368 | 11/2015 |
| JP | 2018-518096 | 7/2018 |
| JP | 2018-156044 | 10/2018 |
| KR | 10-1405202 | 6/2014 |
| KR | 10-2015-0029974 | 3/2015 |
| KR | 10-2015-0092996 | 8/2015 |
| KR | 10-2016-0049347 | 5/2016 |
| KR | 10-2017-0140314 | 12/2017 |
| KR | 10-2018-0040426 | 4/2018 |
| KR | 10-2018-0109496 | 10/2018 |
| WO | 2016170413 A1 | 10/2016 |
| WO | 2018/222456 | 12/2018 |

OTHER PUBLICATIONS

Communication pursuant to Article 94(3) EPC dated Feb. 17, 2023 in EP Application No. 19908039.1.
International Search Report for PCT/KR2019/018470, dated Apr. 17, 2020, 4 pages.
Written Opinion of the ISA for PCT/KR2019/018470, dated Apr. 17, 2020, 9 pages
Office Action dated Nov. 27, 2023 in Korean Patent Application No. 10-2019-0000932 and English-language translation.
Office Action dated Mar. 19, 2024 in Chinese Patent Application No. 201980087837.5 and English-language translation.

* cited by examiner

100

ELECTRONIC APPARATUS AND CONTROLLING METHOD THEREOF

This application is the U.S. national phase of International Application No. PCT/KR2019/018470 filed 26 Dec. 2019, which designated the U.S. and claims priority to KR Patent Application No. 10-2019-0000932 filed 3 Jan. 2019, the entire contents of each of which are hereby incorporated by reference.

BACKGROUND

Field

This disclosure relates to an electronic apparatus and a controlling method thereof and more particularly, to an electronic apparatus that performs voice recognition and a controlling method thereof.

Description of Related Art

Recently, a number of electronic apparatuses are equipped with a voice recognition function. A user can easily execute the voice recognition function by uttering a designated trigger word.

When determining that a user utters a trigger word, an electronic apparatus may enter a voice command recognition mode to identify the user's intention included in the uttered word and perform an operation corresponding to the voice command.

Conventionally, even if the electronic apparatus recognizes the trigger word and enters the voice recognition mode, the user's voice command has been unrecognized or misrecognized frequently.

In particular, the electronic apparatus performs voice recognition without considering the distance between a microphone and the user, the intensity of the user's uttered voice, etc. Accordingly, when the voice command is misrecognized, the user needs to re-utter the voice command after adjusting the distance from the microphone or adjusting the intensity of the uttered voice, which causes inconvenience to the user.

Accordingly, there is a need for a technology that performs voice recognition by considering the distance from the microphone and the intensity of the user's uttered voice.

SUMMARY

The disclosure has been made to solve the above-described problems, and an object of the disclosure is to provide an electronic apparatus that improves a voice recognition rate by adjusting the intensity of a sound signal and a controlling method thereof.

According to an embodiment, an electronic apparatus includes a microphone, a communication interface including circuitry and a processor configured to, based on identifying that a trigger word is included in a first sound signal received through the microphone, enter a voice recognition mode, identify a gain value for adjusting an intensity of the first sound signal to be in a predetermined intensity range based on the intensity of the first sound, adjust an intensity of a second sound signal received through the microphone in the voice recognition mode based on the identified gain value, and control the communication interface to transmit a user command obtained based on voice recognition regarding the adjusted second sound signal, to an external apparatus.

The processor may be configured to, based on the intensity of the first sound signal being equal to or greater than a first threshold value in a specific frequency band, identify the gain value for decreasing the intensity of the first sound signal to the predetermined intensity, and based on the intensity of the first sound signal being less than the first threshold value in the specific frequency band, identify the gain value for increasing the intensity of the first sound signal to the predetermined intensity.

The processor may be configured to, based on the intensity of the first sound signal exceeding a sound collection band of the microphone for a specific threshold period, identify the gain value for decreasing the intensity of the first sound signal to the predetermined intensity.

The processor may be configured to control the communication interface to transmit the second sound signal whose intensity is adjusted to an external server that performs voice recognition, and control the communication interface to transmit the received user command to the external apparatus.

The processor may be configured to identify whether the external apparatus is in a turned-on state or in a turned-off state through the communication interface, based on identifying that the external apparatus is in a turned-on state, transmit the user command to the external apparatus, and based on identifying that the external apparatus is in a turned-off state, control the communication interface to transmit a control command for turning on the external apparatus and the user command to the external apparatus.

The apparatus may further include a speaker, and the processor may be configured to, based on the identified gain value being a gain value for increasing the intensity of the first sound signal, increase an output volume of the speaker to correspond to the gain value, and based on the identified gain value being a gain value for decreasing the intensity of the first sound signal, decrease the output volume of the speaker to correspond to the gain value.

The apparatus may further include a storage including the trigger word and storing signal data corresponding to a plurality of signals of different intensities, respectively, and the processor may be configured to, based on the first sound signal corresponding to one of the plurality of signal data stored in the storage, enter the voice recognition mode.

The storage may be configured to store a noise extraction algorithm for performing noise filtering and echo canceling, and the processor may be configured to, after extracting a noise of the first sound signal using the noise extraction algorithm, identify whether the first sound signal corresponds to one of the plurality of signal data.

The processor may be configured to re-adjust the gain value based on a result of comparison between the intensity of the received second sound signal and the predetermined intensity range.

The electronic apparatus may be a remote control device for controlling the external apparatus remotely.

A controlling method of an electronic apparatus according to an embodiment includes, based on identifying that a trigger word is included in a first sound signal received through the microphone, entering a voice recognition mode, identifying a gain value for adjusting an intensity of the first sound signal to be in a predetermined intensity range based on the intensity of the first sound, adjusting an intensity of a second sound signal received through the microphone in the voice recognition mode based on the identified gain value, and transmitting a user command obtained based on voice recognition regarding the adjusted second sound signal, to an external apparatus.

The identifying a gain value may include, based on the intensity of the first sound signal being equal to or greater than a first threshold value in a specific frequency band, identifying the gain value for decreasing the intensity of the first sound signal to the predetermined intensity, and based on the intensity of the first sound signal being less than the first threshold value in the specific frequency band, identifying the gain value for increasing the intensity of the first sound signal to the predetermined intensity.

The identifying a gain value may include, based on the intensity of the first sound signal exceeding a sound collection band of the microphone for a specific threshold period, identifying the gain value for decreasing the intensity of the first sound signal to the predetermined intensity.

The transmitting a user command to an external apparatus may include transmitting the second sound signal whose intensity is adjusted to an external server that performs voice recognition and transmitting the received user command to the external apparatus.

The method may include identifying whether the external apparatus is in a turned-on state or in a turned-off state, and the transmitting a user command to an external apparatus may include, based on identifying that the external apparatus is in a turned-on state, transmitting the user command to the external apparatus, and based on identifying that the external apparatus is in a turned-off state, transmitting a control command for turning on the external apparatus and the user command to the external apparatus.

The method may include, based on the identified gain value being a gain value for increasing the intensity of the first sound signal, increasing an output volume of the speaker to correspond to the gain value, and based on the identified gain value being a gain value for decreasing the intensity of the first sound signal, decrease the output volume of the speaker to correspond to the gain value.

The electronic apparatus may include the trigger word and store signal data corresponding to a plurality of signals of different intensities, respectively, and the entering a voice recognition mode may include, based on the first sound signal corresponding to one of the plurality of signal data stored in the storage, entering the voice recognition mode.

The electronic apparatus may store a noise extraction algorithm for performing noise filtering and echo canceling, and the entering a voice recognition mode may include, after extracting a noise of the first sound signal using the noise extraction algorithm, identifying whether the first sound signal corresponds to one of the plurality of signal data.

The method may include re-adjusting the gain value based on a result of comparison between the intensity of the received second sound signal and the predetermined intensity range.

The electronic apparatus may be a remote control device for controlling the external apparatus remotely.

According to various embodiments of the present disclosure, an electronic apparatus may adjust the intensity of a sound signal based on the distance between a user and the electronic apparatus, the intensity of the user's uttered voice, etc., and as the misrecognition rate of the voice decreases, voice control regarding the electronic apparatus can be performed easily according to the user's intention.

DETAILED DESCRIPTION

Figure 1:
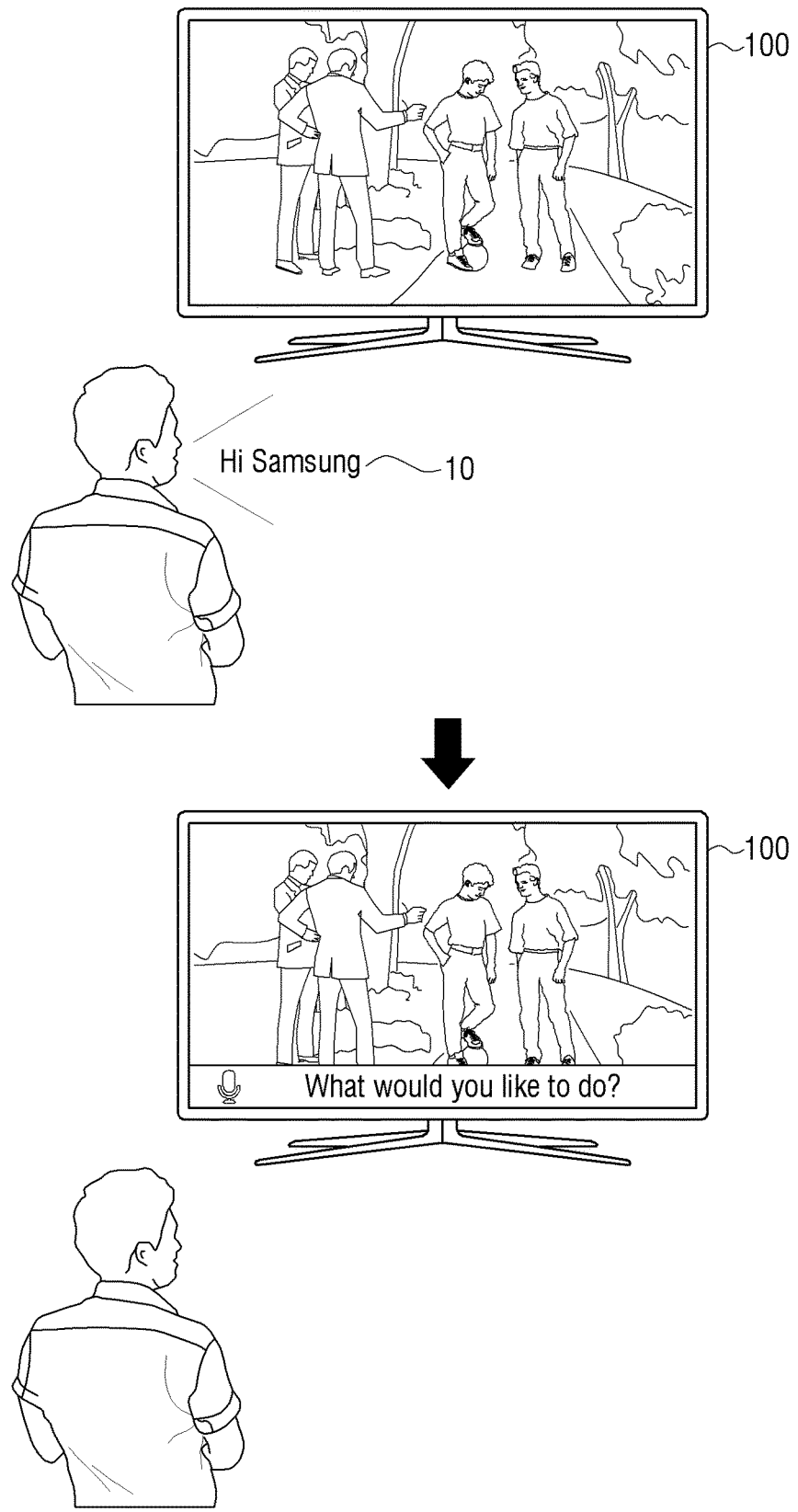
FIG. 1 is a view provided to explain an operation of activating a voice recognition mode according to an embodiment.

Hereinafter, the present disclosure will be described in detail with reference to accompanying drawings.

General terms that are currently widely used were selected as terms used in embodiments of the disclosure in consideration of functions in the disclosure, but may be changed depending on the intention of those skilled in the art or a judicial precedent, an emergence of a new technique, and the like. In addition, in a specific case, terms arbitrarily chosen by an applicant may exist. In this case, the meaning of such terms will be mentioned in detail in a corresponding description portion of the disclosure. Therefore, the terms used in the disclosure should be defined on the basis of the meaning of the terms and the contents throughout the disclosure rather than simple names of the terms.

In the disclosure, an expression "have", "may have", "include", "may include", or the like, indicates an existence of a corresponding feature (for example, a numerical value, a function, an operation, a component such as a part, or the like), and does not exclude an existence of an additional feature.

Expressions such as "A or/and B" should be understood to mean one of "A","B" or "A and B.

Expressions "first", "second", and the like, used in the disclosure may indicate various components regardless of a sequence and/or importance of the components, will be used only in order to distinguish one component from the other components, and do not limit the corresponding components.

When it is mentioned that any component (e.g., a first component) is "(operatively or communicatively) coupled with/to" or is "connected to" another component (e.g., a second component), it is to be understood that any component is directly coupled with/to another component or may be coupled with/to another component through the other component (e.g., a third component).

Singular forms used herein are intended to include plural forms unless explicitly indicated otherwise. It is to be understood that terms 'comprise' or 'include' used in the specification, specify the presence of features, numerals, steps, operations, components, parts mentioned in the present specification or combinations thereof, but do not preclude the presence or addition of one or more other features, numerals, steps, operations, components, parts or combinations thereof.

In the description, the word "module" or "unit" refers to a software component, a hardware component, or a combination thereof, which is capable of carrying out at least one function or operation. A plurality of modules or units may be integrated into at least one module and realized using at least one processor (not shown) except for those modules or units that need to be realized in specific hardware.

In the disclosure, a term "user" may refer to a person using an electronic apparatus or an apparatus (for example, an artificial intelligence electronic apparatus) using an electronic apparatus.

Hereinafter, an embodiment of the present disclosure will be described in greater detail with reference to accompanying drawings.

FIG. 1 is a view provided to explain an operation of activating a voice recognition mode according to an embodiment.

Referring to FIG. 1, an electronic apparatus 100 may enter a voice recognition mode according to a user's uttered voice.

FIG. 1 illustrates that the electronic apparatus 100 is a TV, but this is only an example. The electronic apparatus 100 may be implemented in various forms. The electronic apparatus according to various embodiments may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), MP3 players, medical devices, cameras, or wearable devices. A wearable device may include at least one of an accessory type of a device (e.g., a timepiece, a ring, a bracelet, an anklet, a necklace, glasses, a contact lens, or a head-mounted-device (HMD)), one-piece fabric or clothes type of a circuit (e.g., electronic clothes), a body-attached type of a circuit (e.g., a skin pad or a tattoo), or a bio-implantable type of a circuit. According to an embodiment, the electronic apparatus may include at least one of, for example, televisions (TVs), digital versatile disc (DVD) players, audios, refrigerators, air-conditioners, cleaners, ovens, microwave ovens, washing machines, air cleaners, set-top boxes, home automation control panels, security control panels, media boxes (e.g., Samsung HomeSync™, Apple TV™, or Google TV™), game consoles (e.g., Xbox™ or PlayStation™), electronic dictionaries, electronic keys, camcorders, electronic picture frames, or the like.

According to another embodiment, the electronic apparatus may include at least one of medical devices (e.g., various portable medical measurement devices (e.g., a blood glucose monitoring device, a heartbeat measuring device, a blood pressure measuring device, a body temperature measuring device, and the like)), a magnetic resonance angiography (MRA), a magnetic resonance imaging (MRI), a computed tomography (CT), scanners, and ultrasonic devices, etc.), navigation devices, global navigation satellite system (GNSS), event data recorders (EDRs), flight data recorders (FDRs), vehicle infotainment devices, electronic equipment for vessels (e.g., navigation systems, gyrocompasses, and the like), avionics, security devices, head units for vehicles, industrial or home robots, drones, automatic teller's machines (ATMs) of banking institutions, points of sales (POSs) of stores, or internet of things (e.g., light bulbs, various sensors, sprinkler devices, fire alarms, thermostats, street lamps, toasters, exercise equipment, hot water tanks, heaters, boilers, and the like).

The electronic apparatus 100 according to an embodiment may receive a user's uttered voice. For example, the electronic apparatus 100 may have a microphone (not shown), and receive a user's uttered voice through the microphone.

Subsequently, the electronic apparatus 100 may activate a voice recognition mode based on the received uttered voice.

Here, the voice recognition mode may be a mode in which the electronic apparatus 100 recognizes a user's voice command and performs an operation corresponding to the voice command.

Meanwhile, the electronic apparatus 100 may receive a user's uttered voice from a remote control device including a microphone (not shown) or an external electronic apparatus (not shown).

In another example, the electronic apparatus 100 may be implemented as a remote control device or a user terminal device equipped with a microphone, and may receive a user's uttered voice 10 through the microphone. In this case, the electronic apparatus 100 may control an external electronic apparatus such as TV, etc. to enter a voice recognition mode based on a user's uttered voice.

The electronic apparatus 100 according to an embodiment may identify whether a user's uttered voice is a predetermined word. Here, the predetermined word may be a word having a predetermined length of three or four syllables, which activates the voice recognition mode.

Referring to FIG. 1, it is assumed that the electronic apparatus 100 receives a first sound signal 10 according to a user's uttered voice. When identifying that a predetermined word (e.g., 'Hi Samsung') is included in the first sound signal 10, the electronic apparatus 100 may enter a voice recognition mode. Here, when the electronic apparatus 100 enters the voice recognition mode, the electronic apparatus 100 may activate a mode in which a user's voice command can be recognized (e.g., a component related to voice recognition enters a normal mode from a standby mode, power is suppled to a component related to voice recognition, etc.).

When the electronic apparatus 100 enters the voice recognition mode, the electronic apparatus 100 may display a content which is being provided to the user in a general mode on one area and display a UI indicating that the mode is changed to the voice recognition mode on the remaining area. Meanwhile, this is only an example, and the present disclosure is not limited thereto.

In another example, the electronic apparatus 100 may notify the user that it enters the voice recognition mode (or the mode is converted from the general mode to the voice recognition mode) through a sound (e.g., a beep sound).

In yet another example, when it is identified that a predetermined word (e.g., 'Hi Samsung) is not included in the first sound signal 10 corresponding to the user's uttered voice, the electronic apparatus 100 may ignore the received first sound 10. For example, the electronic apparatus 100 may maintain the general mode.

Here, the predetermined word may be referred to a trigger word, a wake-up ward, etc. Hereinafter, the predetermined word will be collectively referred to as a trigger word for convenience of explanation. The trigger word may be pre-set in the manufacturing stage of the electronic apparatus 100, and editing such as addition or deletion may be possible according to the user's setting. In another example, the trigger word may be changed or added through firmware updating or the like.

Figure 2:
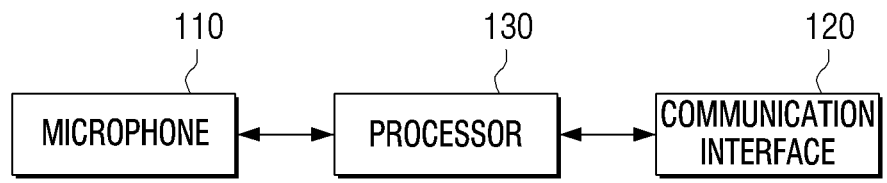
FIG. 2 is a block diagram illustrating configuration of an electronic apparatus according to an embodiment.

FIG. 2 is a block diagram illustrating configuration of an electronic apparatus according to an embodiment.

Referring to FIG. 2, the electronic apparatus 100 includes a microphone 110, a communication interface 120 and a processor 130.

The microphone 110 is configured to collect a sound signal. The microphone 110 is configured to collect a user's uttered voice or other sounds, convert a sound signal into an electrical signal, and transmit the converted electrical signal to the processor 130.

The microphone 110 according to an embodiment be formed integrally with the electronic apparatus 100 at an upper side, in a front direction, in a side direction, or the like, of the electronic apparatus 100. The microphone 110 may include various components such as a microphone collecting a user voice in an analog form, an amplifier (AMP) circuit amplifying the user voice to a certain gain value, an A/D conversion circuit sampling the amplified user voice and converting the user voice into a digital signal, and a filter circuit removing a noise component from the digital signal obtained by the conversion.

The communication interface 120 including circuitry is configured to perform communication with various types of external apparatuses according to various types of communication methods.

In particular, the communication interface 120 according to an embodiment may perform communication with an external server, an external electronic apparatus and the like. For example, the communication interface 120 may transmit a sound signal received through the microphone 110 to an external server under the control of the processor 130, and receive a user command corresponding to the sound signal, a user's uttered text included in the sound signal and the like. Here, the external server may be a server that performs voice recognition. In another example, the electronic apparatus 100 may be implemented as a remote control device, and the communication interface 120 may perform communication with the external electronic apparatus under the control of the processor 130 and transmit a user command Here, the user command may mean a command (or a control signal) for controlling the external electronic apparatus.

The processor 130 controls the overall operations of the electronic apparatus 100.

The processor 130 may be implemented as a digital signal processor (DSP) processing a digital signal, a microprocessor, or a time controller (TCON). However, the processor 130 is not limited thereto, but may include one or more of a central processing unit (CPU), a micro controller unit (MCU), a micro processing unit (MPU), a controller, an application processor (AP), a graphics-processing unit (GPU) or a communication processor (CP), or an ARM processor, or may be defined by these terms. In addition, the processor 130 may be implemented as a system-on-chip (SoC) or a large scale integration (LSI) in which a processing algorithm is embedded or may be implemented in a field programmable gate array (FPGA) form. The processor 130 may perform various functions by executing computer executable instructions stored in the storage 140.

In particular, when a user's uttered voice is received through the microphone 110, the processor 130 may identify whether a trigger word is included in the uttered voice. According to an embodiment, as illustrated in FIG. 1, when the first sound signal 10 is received through the microphone 110 in a general mode of the electronic apparatus 100, the processor 130 may identify whether a trigger word is included in the first sound signal 10. Subsequently, when identifying that a trigger word is included in the first sound signal 10, the processor 130 may enter the voice recognition mode.

When the electronic apparatus 100 enters the voice recognition mode, the processor 130 according to an embodiment may identify a gain value for adjusting the intensity of the first sound signal 10 to be in a predetermined intensity range based on the intensity of the first sound signal 10. Subsequently, the processor 130 may adjust the intensity of the second sound signal 20 received through the microphone 110 in the voice recognition mode based on the identified gain value. In addition, the processor 130 may control the communication interface 120 to transmit a user command obtained based on the voice recognition regarding the adjusted second sound signal to an external apparatus, which will be described in detail with reference to FIG. 4.

Figure 4:
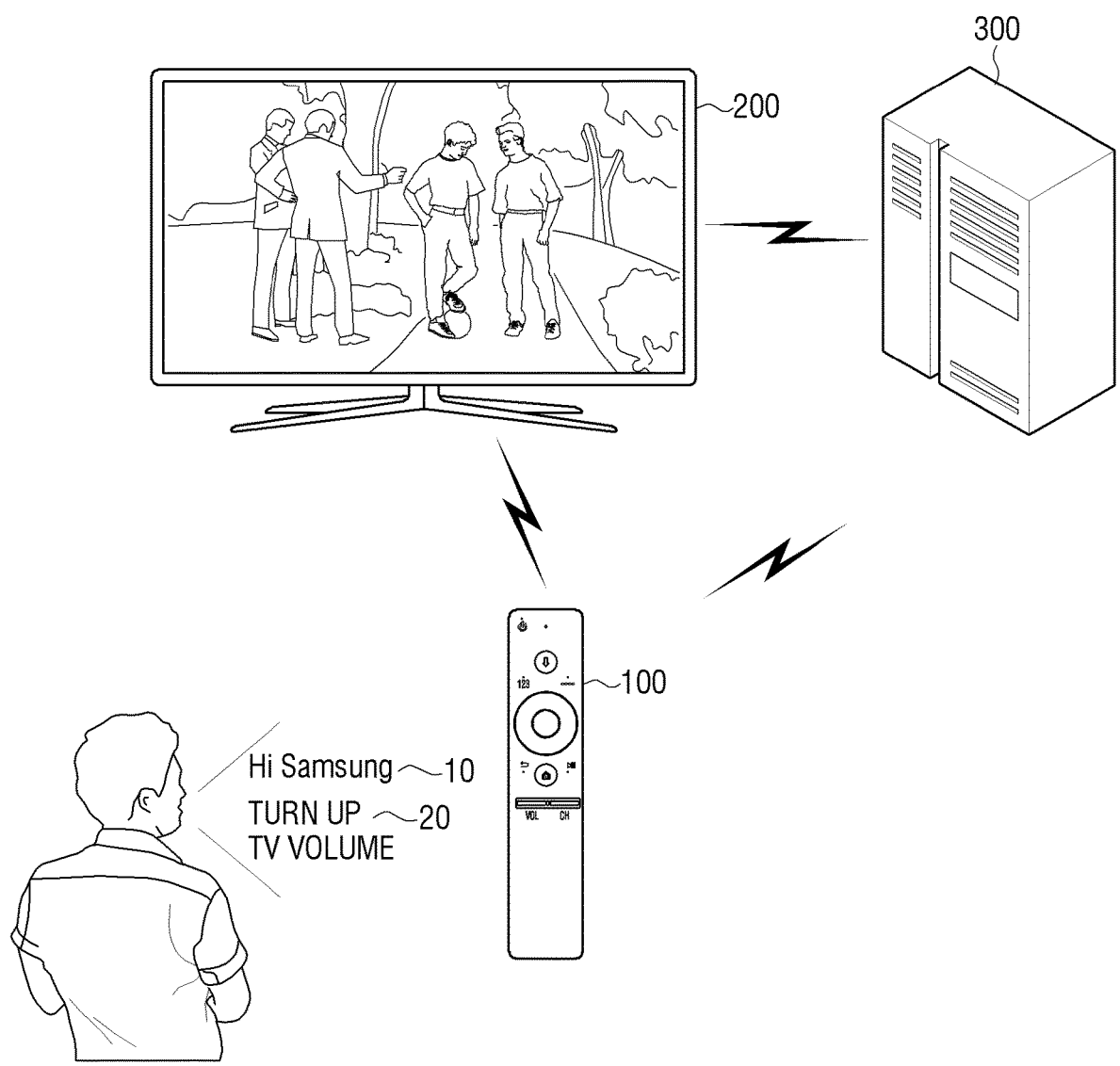
FIG. 4 is a view provided to explain first and second sound signals according to an embodiment.

FIG. 4 is a view provided to explain first and second sound signals according to an embodiment.

Referring to FIG. 4, the electronic apparatus 100 may be implemented as a remote control device for controlling an external apparatus 200. When it is identified that a trigger word (e.g., 'Hi Samsung') is included in the first sound signal, the processor 130 according to an embodiment may enter the voice recognition mode. Here, the voice recognition mode may mean a mode in which a component used to perform voice recognition, among components provided in the electronic apparatus 100, is activated. For example, the voice recognition mode may mean a mode in which a Digital Signal Processor (DSP) for voice recognition provided in the electronic apparatus 100 is activated. In addition, the voice recognition mode may mean a mode in which when the electronic apparatus 100 is implemented as a remote control device, it receives a voice command for controlling the external apparatus 200 with the user's uttered voice.

The processor 130 according to an embodiment, when it is identified that a trigger word is included in the first sound signal 10, may identify a gain value for adjusting the intensity of the first sound signal 10 to be in a predetermined intensity range based on the intensity of the first sound signal 10. Here, the gain value may refer to a ratio at which an amplifier (AMP) circuit provided in the microphone 110 amplifies or reduces a sound signal with reference to a predetermined standard. The gain value is a characteristic value of the amplifier circuit, and may refer to a ratio of an input signal to an output signal. For example, the microphone 110 may output an input (or collected) sound signal by amplifying or reducing the sound signal at a predetermined ratio using the amplifier circuit. According to an embodiment, when the gain value increases, the amplifier circuit may amplify the intensity of the intensity of the sound signal, and when the gain value decreases, the amplifier circuit may reduce the intensity of the sound signal. Here, the intensity of the signal may be determined according to a decibel (dB) and a frequency (Hz). For example, the stronger the decibels and the higher the frequency, the greater the intensity of the signal.

The processor 130 according to an embodiment may identify a gain value for amplifying or reducing the intensity of the sound signal based on the intensity of the first sound signal 10. For example, if the predetermined intensity range of the signal is 50 to 70 dB, the processor 130 may identify a gain value for adjusting the intensity of the first sound signal 10 to be in the predetermined intensity range of 50 to 70 dB. Subsequently, the processor 130 may adjust the intensity of the second sound signal 20 received through the microphone 110 after entering the voice recognition mode based on the identified gain value. Here, the intensity range of 50 to 70 dB is only an example, and the intensity range is not limited thereto.

The intensity of the sound signal received through the microphone 110 is inversely proportional to the distance between the microphone, that is, the electronic apparatus 100 and a user, and is proportional to the intensity (dB) of the user's uttered voice. As the distance between the electronic apparatus 100 and the user increases, the intensity of the sound signal received through the microphone 110 may decrease. In another example, as the intensity (dB) of the user's uttered voice decreases, the intensity of the sound signal received through the microphone 110 may decrease. In this case, the accuracy of voice recognition regarding the user's uttered voice in the voice recognition mode may decrease.

The processor 130 according to an embodiment, after the electronic apparatus 100 or the external apparatus 200 enters the voice recognition mode, may identify a gain value based on the first sound signal 10 so that the intensity of the second sound signal 20 received through the microphone 110 is included in the predetermined intensity range.

Subsequently, the processor 130 may adjust the intensity of the second sound signal 20 based on the identified gain value. The processor 130 may obtain a user command based on voice recognition regarding the second sound signal 20. For example, the processor 130 may perform voice recognition for the second sound signal 20 on its own and obtain a text (e.g., turn up the TV volume). Subsequently, the processor 130 may control the communication interface 120 to transmit a user command for controlling the external apparatus 200 to correspond to the text, to the external apparatus 200.

In another example, the processor 130 may control the communication interface 120 to transmit the second sound signal 20 of which intensity is adjusted according to the identified gain value to the external server 300 that performs voice recognition. Subsequently, the processor 130 may control the communication interface 120 to transmit a user command received from the external server 300 to the external apparatus 200. In another example, when receiving a text corresponding to the second sound signal 20 from the external server 300, the processor 130 may control the communication interface 120 to transmit a user command (or a control signal) corresponding to the received text to the external apparatus 200.

According to another embodiment, it may be assumed that the electronic apparatus 100 is limited in communication with respect to the external server 300. In this case, the electronic apparatus 100 may perform communication with the external apparatus 200, and obtain a user command corresponding to the second sound signal 20 through the external apparatus 200. For example, the electronic apparatus 100 may transmit the second sound signal 20 or a text corresponding to the second sound signal 20 to the external apparatus 200. Subsequently, the external apparatus 200 may perform communication with the external server 300 to obtain a user command corresponding to the second sound signal 20 or a user command corresponding to the received text. The external apparatus 200 may operate according to a user command. Even if the electronic apparatus 100 is limited in communication with respect to the external server 300, the electronic apparatus 100 may transmit the second sound signal 10 and a control command to the external apparatus 200 so as to obtain a user command corresponding to the second sound signal 10 from the external server 300.

The processor 130 according to an embodiment may obtain text information of the first sound signal 10. For example, the processor 130 may apply a Speech To Text (STT) function to obtain text information corresponding to the first sound signal 10. The processor 130 may apply the STT function directly to the first sound signal 10 to obtain text information and in some cases, may receive text information corresponding to the first sound signal 10 from the external server 300. For example, the processor 130 may transmit the first sound signal 10 to the server. The external server 300 may convert the first sound signal 10 to text information using the STT function, and transmit the text information to the electronic apparatus 100.

The processor 130 may transmit the received second sound signal 20 as it is (without intensity adjustment) to the external server 300, transmit the second sound signal 20 to the external server 300 after adjusting its intensity based on the identified gain value instead of performing voice recognition, or increase a voice recognition rate by performing voice recognition. In particular, when it is identified that a trigger word is included in the first sound signal 10, the processor 130 may obtain a gain value based on the first sound signal 10.

Referring back to FIG. 2, when the intensity of the first sound signal 10 is equal to or greater than a first threshold value in a specific frequency band, the processor 130 according to an embodiment may identify a gain value for decreasing the intensity of the first sound signal 10 to a predetermined intensity, which will be described in detail with reference to FIG. 5.

Figure 5:
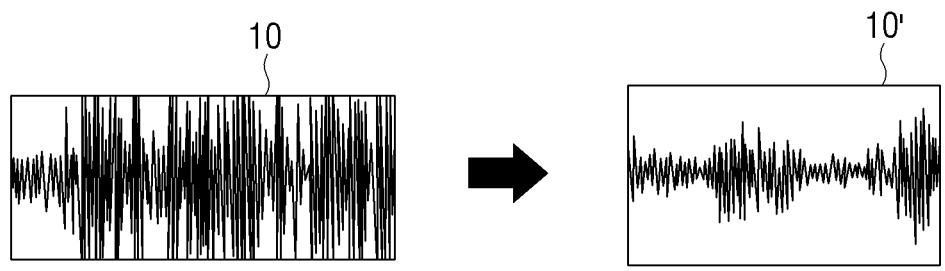
FIG. 5 is a view provided to explain an intensity of a sound signal and a gain value according to an embodiment.

FIG. 5 is a view provided to explain an intensity of a sound signal and a gain value according to an embodiment.

Referring to FIG. 5, the processor 130 according to an embodiment may identify whether the intensity of the first sound signal 10 received through the microphone is equal to or greater than the first threshold value. For example, if the vocal frequency of a general person is 100~300 Hz, the processor 130 may identify whether the intensity of the first sound signal 10 is equal to or greater than the first threshold value in the band of 100~300 Hz. Here, the first threshold value may be 70 dB. Meanwhile, the specific frequency band of 100~300 Hz and the first threshold value of 70 dB are only examples and they are not limited thereto. According to an embodiment, conversation between people at a distance of 1M corresponds to an average intensity of 60 dB, and conversation in a department store, a shopping mall, etc. corresponds to an average intensity of 70 dB. The processor 130 according to an embodiment, when the first sound signal 10 of 70 dB or more is received, may identify that the voice recognition rate of the second sound signal 20 received through the microphone 110 following the first sound signal 10 would be significantly deteriorated. The processor 130 may identify a gain value for adjusting the intensity of the first sound signal to be equal to or less than 70 dB. Subsequently, the processor 130 may decrease (or amplify) the intensity of the second sound signal 20 based on the identified gain value.

The processor 130 according to another embodiment, when the intensity of the first sound signal 10 exceeds a sound collection band of the microphone 110 for a specific threshold time, may identify a gain value for reducing the intensity of the first sound signal to a predetermined intensity.

The microphone 110 according to an embodiment may have a sound collection band of a certain range. Here, the sound collection range may refer to a maximum sound pressure level (SPL). For example, if the maximum sound pressure level of the microphone 110 is 124 dB SPL, the microphone 110 may receive a sound signal of 0 to 124 dB. The microphone 110 may collect a sound signal exceeding 124 dB. In other words, saturation occurs.

Referring to FIG. 5, if the first sound signal 10 exceeding the sound collection band of the microphone 110 is received for a specific threshold time, the processor 130 may identify a gain value for reducing the intensity of the first sound signal to a predetermined intensity. Here, it can be assumed that if the first sound signal 10 exceeds the sound collection band of the microphone 110, it means the distance between the microphone 110 and a user is very close, or the intensity of the user's uttered voice is very large. In this case, after the electronic apparatus 100 enters the voice recognition mode, the voice recognition rate regarding the second sound signal may significantly decrease. The processor 130 may maintain the voice recognition rate to a constant level by performing voice recognition after reducing (or amplifying) the intensity of the second sound signal 20 based on the identified gain value. Here, the sound collection band and maximum sound pressure level of the microphone 110 may vary according to the performance of the microphone 10, the manufacturing purpose of the manufacturer, and the like.

Referring back to FIG. 2, if the intensity of the first sound signal 10 is less than the first threshold value in a specific frequency band, the processor 130 according to an embodiment may identify a gain value for increasing the intensity of the first sound signal 10 to a predetermined intensity, which will be described in detail with reference to FIG. 6.

Figure 6:
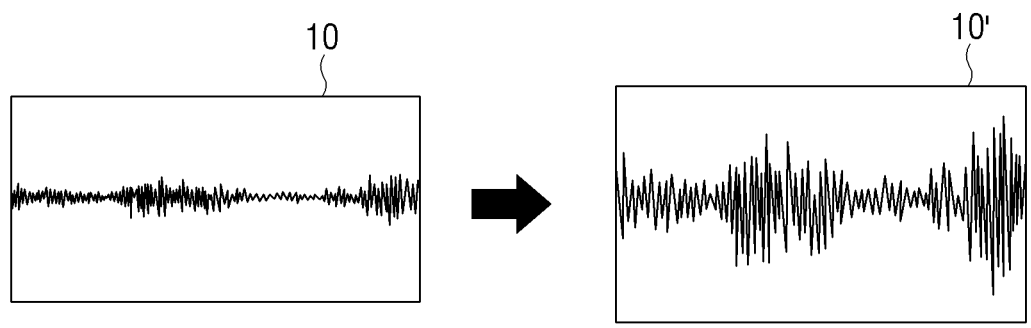
FIG. 6 is a view provided to explain an intensity of a sound signal and a gain value according to another embodiment.

FIG. 6 is a view provided to explain an intensity of a sound signal and a gain value according to another embodiment.

Referring to FIG. 6, the processor 130 according to an embodiment may identify whether the first sound signal 10 received through the microphone in a specific frequency band is less than the first threshold value. For example, it is identified whether the intensity of the first sound signal 10 is less than the first threshold value in the band of 100 to 300 Hz, which is a voice frequency of a general person. Here, the first threshold value may be 40 dB. Meanwhile, setting the band of 100 to 300 Hz as the specific frequency band and 40 dB as the first threshold value is only an example, and the specific frequency band and the first threshold value are not limited thereto.

According to an embodiment, a quiet talk between people, a conversation like whispering, etc. may correspond to an average intensity of 40 dB. If it is identified that the first sound signal having the intensity of less than 40 dB includes a trigger word, the processor 130 according to an embodiment may predict that the second sound signal 20 which is received following the first sound signal 10 would also have the intensity less than 40 dB. There is a concern that the processor 130 according to an embodiment would recognize the second sound signal 20 having an intensity less than the first threshold value with a remarkably low recognition rate.

When the first sound signal 10 having an intensity less than the first threshold value, the processor 130 according to an embodiment may identify a gain value based on the intensity of the first sound signal 10 so that the second sound signal 20 received through the microphone 110 following the first sound signal 10 has a predetermined intensity range. Subsequently, the processor 130 may amplify (or reduce) the intensity of the second sound signal 20 based on the identified gain value.

Referring back to FIG. 2, the processor 130 according to an embodiment may identify whether the external apparatus 200 is in a turned-on state or in a turned-off state through the communication interface 120. Subsequently, the processor 130 may control the communication interface 120 to transmit a control command for turning on the external apparatus 200 based on a result of identification, which will be described in detail with reference to FIG. 7.

Figure 7:
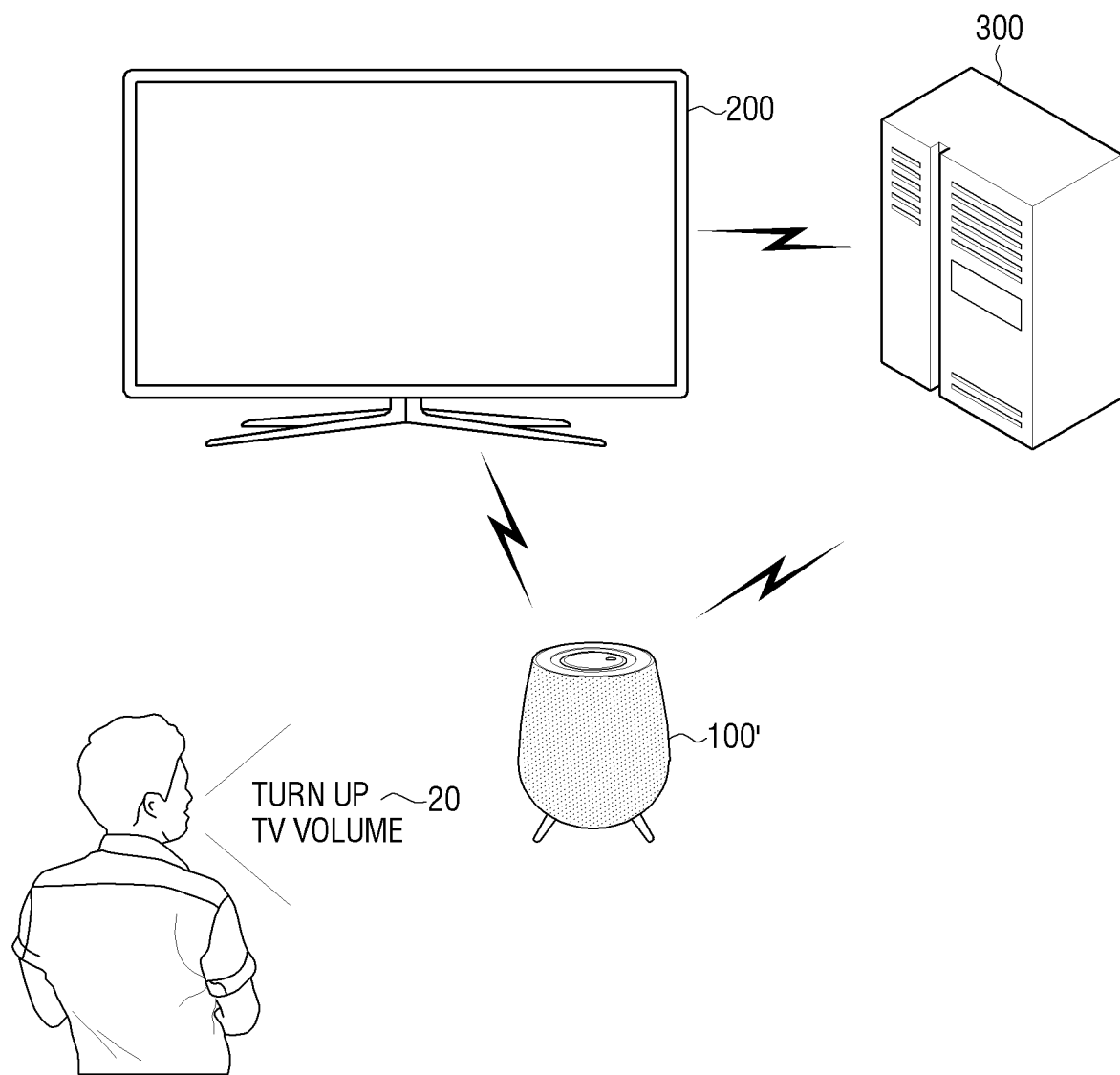
FIG. 7 is a view provided to explain a control command according to an embodiment.

FIG. 7 is a view provided to explain a control command according to an embodiment.

Referring to FIG. 7, the electronic apparatus 100 according to an embodiment may be implemented as an AI speaker 100' other than a remote control device.

The processor 130 may identify whether the external apparatus 200 for controlling using the electronic apparatus 100 is in a turned-on state or in a turned-off state through the communication interface 120.

The processor 130 according to an embodiment may control the communication interface 120 to transmit a specific packet or a specific signal in order to identify whether the external apparatus 200 is turned on. Subsequently, if a response packet corresponding to the specific packet is received from the external apparatus 200 through the communication interface 120, the processor 130 may identify that the external apparatus 200 is in a turned-on state.

In another example, if a specific packet or a specific signal transmitted from the external apparatus 200 while the external apparatus 200 is turned on is received through the communication interface 120, the processor 130 may identify that the external apparatus 200 is in a turned-on state. In another example, the electronic apparatus 100 and the external apparatus 200 may be connected through Bluetooth pairing. In this case, the electronic apparatus 100 may identify the turned-on state of the external apparatus 200 based on whether the pairing connection with the external apparatus 200 has been completed. For example, when the pairing connection with the external apparatus 200 is completed, the processor 130 may determine that the external apparatus 200 is in a turned-on state.

According to an embodiment, the processor 130 may enter the voice recognition mode based on the first sound signal 10 including a trigger word, and perform voice recognition regarding the second sound signal 20. Here, the second sound signal 20 may be a user's uttered voice for controlling the external apparatus 200.

Subsequently, the processor 130 may perform recognition regarding the second sound signal either using the external server 300 or on its own, and obtain a user command corresponding to the second sound signal 20.

When it is identified that the external apparatus 200 is in a turned-on state, the processor 130 according to an embodiment may transmit the obtained user command (e.g., 'turn up the TV volume') to the external apparatus 200.

In another example, when it is identified that the external apparatus 200 is in a turned-off state, the processor 130 may control the communication interface 120 to transmit a control command for turning on the external apparatus 200 and a user command to the external apparatus 200.

When it is identified that external apparatus 200 is in a turned-off state, the processor 130 according to another embodiment may control the communication interface 120 to transmit a control command (e.g., a wake-up packet) for turning on the external apparatus 200 to the external apparatus 200.

In another example, when it is identified that the external apparatus 200 is in a turned-off state, the processor 130 may control the communication interface 120 to transmit a control command for turning on the external 200 and the second sound signal 20 to the external apparatus 200. Subsequently, the external apparatus 200 may obtain a user command corresponding to the received second sound signal 20 by itself, or may receive a user command corresponding to the second sound signal 20 from the external server 200 by transmitting the second sound signal 20 to the external server 300. Then, the external apparatus 200 may perform an operation corresponding to the received user command (e.g., channel change, volume change, etc.).

In another example, when it is identified that a trigger word is included in the first sound signal 10 received through the microphone 110 and the external apparatus 200 is in a turned-off state, the processor 130 may control the communication interface 200 to transmit a control command for turning on the external apparatus 200 to the external apparatus 200.

Referring back to FIG. 2, the electronic apparatus 100 according to an embodiment may include a speaker (not illustrated). Subsequently, if the identified gain value is a gain value for amplifying the intensity of the first sound signal 10, the processor 130 may output an acoustic content by increasing the output volume of the speaker. In another example, if the identified gain value is a gain value for reducing the intensity of the first sound signal 10, the processor 130 may output an acoustic content by reducing the output volume of the speaker. This will be described in detail with reference to FIG. 8.

Figure 8:
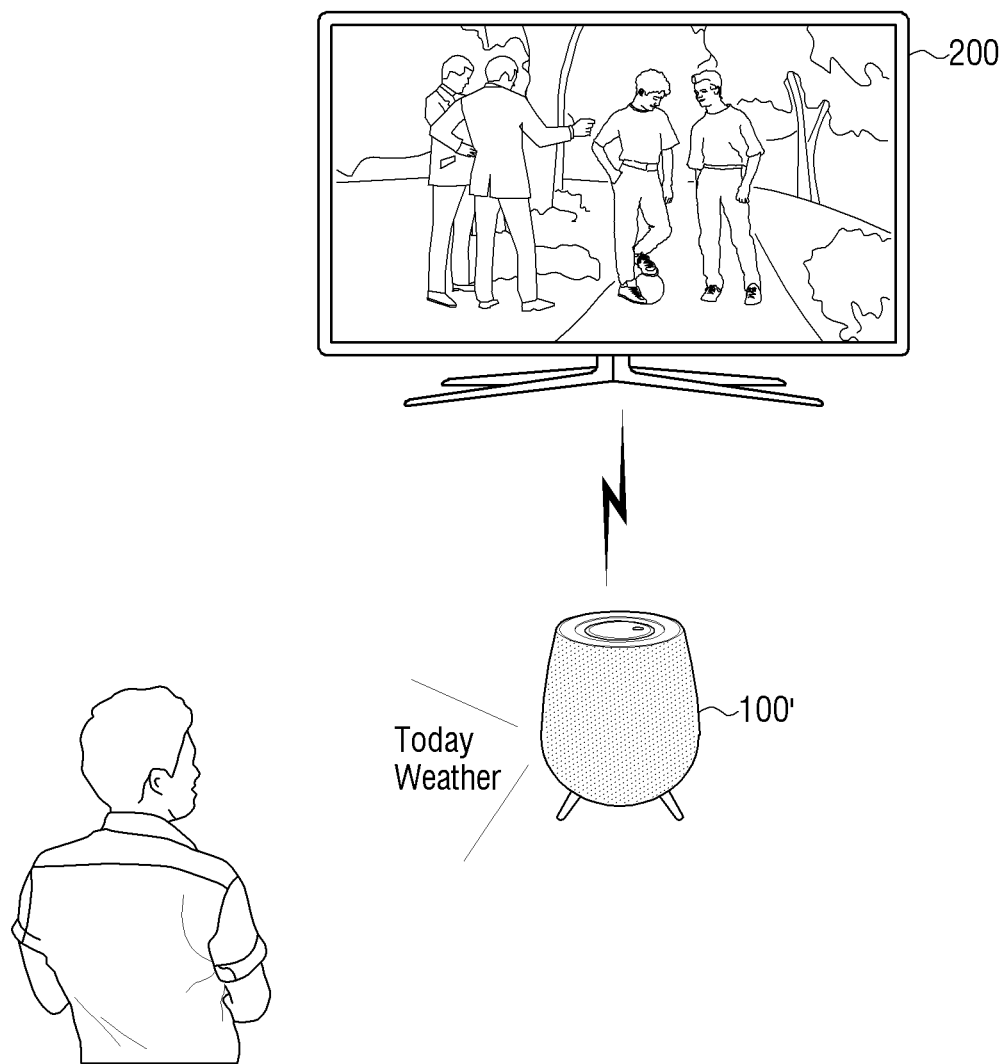
FIG. 8 is a view provided to explain an output volume of an electronic apparatus according to an embodiment.

FIG. 8 is a view provided to explain an output volume of an electronic apparatus according to an embodiment.

Referring to FIG. 8, the processor 130 may identify a distance between the electronic apparatus 100 and a user based on the intensity of the first sound signal 10.

For example, when the distance between the electronic apparatus 100 and a user is 1-2M, and the user's uttered voice has the intensity of 60 dB, the processor 130 may recognize that the user's uttered voice has a high recognition rate.

For example, if the first sound signal 10 received through the microphone 110 exceeds the sound collection band (or the maximum sound pressure level) of the microphone 110, the processor 130 may identify that the distance between the electronic apparatus 100 and the user is close within a threshold distance.

In another example, if the intensity of the first sound signal 10 received through the microphone 110 is less than a first threshold value, the processor 130 may identify that the distance between the electronic apparatus 100 and the user exceeds the threshold distance, and the user is located remotely.

When outputting an acoustic content, the processor 130 according to an embodiment may adjust the output volume based on the distance between the electronic apparatus 100 and a user. Referring to FIG. 8, if the identified gain value is a gain value for increasing the intensity of the first sound signal 10, the processor 130 may output an acoustic content by increasing the output volume of the speaker to correspond to the gain value. In another example, if the identified gain value is a gain value for decreasing the intensity of the first sound signal 10, the processor 130 may output an acoustic content by decreasing the output volume of the speaker to correspond to the gain value. The electronic apparatus 100 may provide an acoustic content at an appropriate output volume in consideration of the distance between the user and the electronic apparatus 100.

Referring back to FIG. 2, the processor 130 according to an embodiment may readjust a gain value based on a result of comparison between the intensity of the received second sound signal 10 and a predetermined intensity range, which will be described in detail with reference to FIG. 4.

Referring to FIG. 4, the processor 130 according to an embodiment may obtain a gain value based on the first sound signal 10, and adjust the intensity of the second sound signal 20 based on the obtained gain value. Subsequently, the processor 130 may readjust the gain value based on the adjusted intensity of the second sound signal 20. For example, if the intensity of the first sound signal 10 is equal to or greater than a first threshold value, the processor 130 may identify a gain value for amplifying the intensity of the signal. Subsequently, the processor 130 may amplify the intensity of the second sound signal 20 based on the identified gain value, and re-identify a gain value based on the amplified intensity of the second sound signal (20'). Then, the processor 130 may amplify (or reduce) the intensity of a third sound signal received following the second sound signal 20 based on the re-identified gain value.

Figure 3:
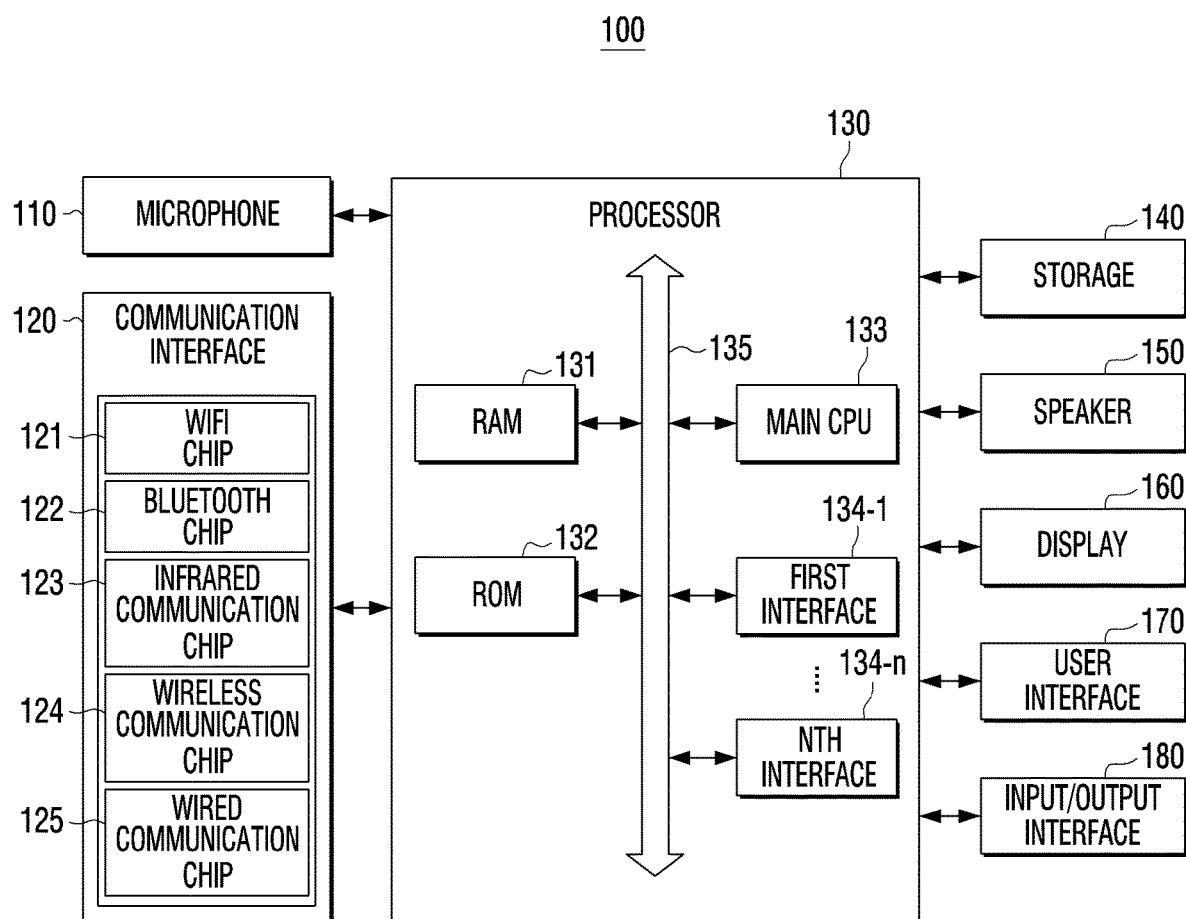
FIG. 3 is a block diagram illustrating detailed configuration of an electronic apparatus according to an embodiment.

FIG. 3 is a block diagram illustrating detailed configuration of an electronic apparatus according to an embodiment.

Referring to FIG. 3, the electronic apparatus 100 according to an embodiment may include the microphone 110, the communication interface 120, the processor 130, a storage 140, a speaker 150, a display 160, a user interface 170, and an input/output interface 180. Detailed descriptions of the components illustrated in FIG. 3, which overlap those illustrated in FIG. 2 will be omitted.

The communication interface 120 is configured to perform communication with various types of external apparatuses according to various types of communication methods. The communication interface 120 includes a WiFi module 121, a Bluetooth module 122, an infrared communication module 123, a wireless communication module 124, and the like. The processor 120 may perform communication with various external apparatuses using the communication interface 120. Here, the external apparatuses may include a display device such as a TV, an image processing device such as a set-top box, an external server, a control device such as a remote controller, a sound output device such as a Bluetooth speaker, a lighting device, a smart cleaner, a home appliance such as a smart refrigerator, a server such as an IoT home manager, etc.

The WiFi module 121, the Bluetooth module 122 perform communication according to a WiFi method and a Bluetooth method, respectively. In the case of using the WiFi module 121 or the Bluetooth module 122, a variety of connection information such as SSID, session keys and the like, are first transmitted and received, communication is established using the connection information, and a variety of information may then be transmitted and received.

The infrared communication module 123 performs communication according to Infrared Data Association (IrDA) technology that transmits data wirelessly at a short distance by using infrared rays between the time light and the millimeter wave.

The wireless communication module 124 may include at least one communication chip that performs communication according to various wireless communication standards such as Zigbee, 3rd generation (3G), 3rd generation partnership project (3GPP), long term evolution (LTE), 4th generation (4G), 5th generation (5G), and the like other than the above-described communication method.

The other communication interface 125 may include at least one of a local area network (LAN) module or an Ethernet module and at least one of wired communication modules performing communication using a pair cable, a coaxial cable, an optical fiber cable, or the like.

According to an embodiment, the communication interface 120 may use the same communication module (e.g., a WiFi module) to communicate with an external apparatus such as a remote controller and an external server.

According to another embodiment, the communication interface 120 may use a different communication module (e.g., a WiFi module) to communicate with an external apparatus such as a remote controller and an external server. For example, the communication interface 120 may use at least one of the Ethernet module or the WiFi module to communicate with the external server, and may use a BT module to communicate with the external apparatus such as the remote controller. However, this is only an example, and the communication interface 120 may use at least one communication module out of various communication modules when communicating with a plurality of external apparatuses or external servers.

According to an embodiment, the communication 120 may perform communication with an external apparatus such as a remote controller and an external server. For example, the communication interface 120 may receive a user's uttered voice from an external apparatus including a microphone. In this case, the received user's uttered voice or voice signal may be a digital voice signal, but it may be an analog signal depending on implementation examples. For example, the electronic apparatus 100 may receive a user's voice signal through a wireless communication method such as Bluetooth, Wi-Fi or the like. Here, the external apparatus may be implemented as a remote controller or a smartphone. According to an embodiment, the external apparatus may install or delete an application for controlling the electronic apparatus 100 according to a manufacturer's purpose, a user's control, etc. For example, a smartphone may install a remote control application for controlling the electronic apparatus 100. Subsequently, a user voice may be received through a microphone included in the smartphone, and a control signal corresponding to the user voice received through the remote control application may be obtained and transmitted to the electronic apparatus 100. Meanwhile, this is an example, and the present disclosure is not limited thereto. For example, the smartphone may transmit the received user voice to a voice recognition server, obtain a control signal corresponding to the user voice from the voice recognition server, and transmit the obtained control signal to the electronic apparatus 100.

The electronic apparatus 100 may transmit the corresponding voice signal to the external server in order for voice recognition of the voice signal received from the external apparatus. The communication interface 120 may perform communication with the external server to receive characteristic information of the sound signal collected through the microphone 110, information on text included in the sound signal, etc.

In this case, the communication module for communication with the external apparatus and the external server may be implemented as one or separately. For example, a Bluetooth module may be used for communication with the external apparatus, and an Ethernet modem or a WiFi module may be used for communication with the external server.

The electronic apparatus 100 according to an embodiment may transmit the received digital voice signal and sound signal to the voice recognition server. In this case, the voice recognition server may convert the sound signal to text information using Speech To Text (STT). Here, the voice recognition server may transmit the text information to another server or another electronic apparatus in order to perform a search corresponding to the text information or in some cases, may perform a search directly.

The processor 131 is configured to control the overall operations of the electronic apparatus 100. For example, the processor 130 may control a plurality of hardware or software components connected to the processor 130 by driving an Operating System (OS) and an application, and may perform various data processing and operations. The processor 130 controls the overall operations of the electronic apparatus 100 using various programs stored in the storage 140.

Specifically, the processor 130 includes a RAM 131, a ROM 132, a main CPU 133, first to nth interfaces 134-1 to 134-*n*, and a bus 135.

The RAM 131, the ROM 132, the main CPU 133, and the first to nth interfaces 134-1 to 134-*n* may be connected with one another through the bus 135.

The ROM 132 stores a set of instructions, etc. for system booting. When a turn-on instruction is input and power is supplied, the main CPU 133 copies the O/S stored in the storage 140 in the RAM 131 according to the instruction stored in the ROM 132, and boots the system by executing the O/S. When booting is completed, the main CPU 133 copies various types of application programs stored in the storage 140 in the RAM 131, and performs various types of operations by executing the application programs copied in the RAM 131.

The main CPU 133 accesses the storage 140, and performs booting by using the O/S stored in the storage 140. Then, the main CPU 133 performs various operations by using various programs, contents data, etc. stored in the storage 140.

The first to nth interfaces 134-1 to 134-*n* are connected with the aforementioned various components. One of the interfaces may be a network interface connected to an external apparatus through a network.

Meanwhile, the processor 130 may perform a graphic processing function (a video processing function). For example, the second processor 130 may generate a screen including various objects such as an icon, an image, a text, etc. using a calculator (not illustrated) and a renderer (not illustrated). Here, the operator (not illustrated) may operate attribute values such as coordinate values, forms, sizes, and colors of each object to be represented according to a layout of the screen based on the received control instruction. The renderer (not illustrated) may generate screens of various layouts including the objects based on the attribute values which are operated by the operator (not illustrated). In addition, the processor 130 may perform various image processing such as decoding, scaling, noise filtering, frame rate conversion, resolution conversion, etc. with respect to video data.

Meanwhile, the processor 130 may perform various processing with respect to audio data. Specifically, the processor 130 may perform various processing such as decoding, amplification, noise filtering with respect to audio data.

The storage 140 stores various data such as an operating system (O/S) software module for driving the electronic apparatus 100, and various data like various kinds of multimedia contents.

The storage 140 may be implemented in the form of an internal memory such as a ROM included in the processor 130 (e.g., electrically erasable programmable read-only memory (EEPROM), RAM, etc., or may be implemented as a memory separate from the processor 130. In this case, the storage 140 may be implemented in the form of a memory embedded in the electronic apparatus 100 according to the data storage use, or may be implemented in the form of a memory detachable from the electronic apparatus 100. For example, in the case of data for driving the electronic apparatus 100, the data may be stored in the memory embedded in the electronic apparatus 100, and in the case of data for extending the functions of the electronic apparatus 100, the data may be stored in a memory detachable from the electronic apparatus 100. Meanwhile, the memory embedded in the electronic apparatus may be implemented as at least one of a volatile memory (e.g.: a dynamic RAM (DRAM), a static RAM (SRAM) or a synchronous dynamic RAM (SDRAM), etc.) or a non-volatile memory (e.g.: an one time programmable ROM (OTPROM), a programmable ROM (PROM), an erasable and programmable ROM (EPROM), an electrically erasable and programmable ROM (EEPROM), a mask ROM, a flash ROM, a flash memory (e.g.: NAND flash or NOR flash, etc.), a hard drive or a solid state drive (SSD)). The memory detachable from the electronic apparatus 100 may include a memory card (e.g., compact flash (CF), secure digital (SD), micro secure digital (Micro-SD), mini secure digital (Mini-SD), extreme digital (xD), multi-media card (MMC), etc.), an external memory that can be connected to a USB port (e.g., a USB memory), etc.

In particular, the storage 140 includes a trigger word, and may store signal data corresponding to a plurality of signals of different intensities.

For example, each of a plurality of signal data may include information on a frequency change rate, an amplitude change rate, signal intensity, etc. when a person utters a trigger word. The utterance frequency and utterance intensity (dB) of the trigger word may vary depending on the structure of a person's mouth, vocal cords, throat, etc., age, gender, race, and the like. According to an embodiment, each of the plurality of signal data may include the frequency change rate, the amplitude change rate, etc. when a trigger word is uttered in difference intensities. The processor 130 according to an embodiment may enter the voice recognition mode when the first sound signal 10 corresponds to one of the plurality of signal data stored in the storage 140.

In addition, the storage 140 may store a noise extraction algorithm for performing noise filter and echo canceling. The processor 130 may extract a noise of the first sound signal 10 using a noise extraction algorithm and identify whether the first sound signal 10' corresponds to one of the plurality of signal data stored in the storage 140.

The speaker 150 performs the function of outputting an audio signal. For example, the speaker 150 may include at least one speaker unit (or an audio amplifier).

Specifically, the speaker 150 may include at least one of a low-range (a woofer) speaker, a mid-range speaker and a high-range (tweeter) speaker. However, the present disclosure is not limited thereto, and the speaker 150 may output sound signals in various sound ranges using a plurality of speakers.

In particular, the speaker 150 according to an embodiment may output an acoustic content at an output volume set according to the control of the processor 130. For example, the processor 130 may increase or decrease the sound signal output volume of the speaker 150 according to a gain value that is identified based on the first sound signal 10.

The display 160 may be implemented as various types of displays such as Liquid Crystal Display (LCD), Organic Light Emitting Diodes (OLED) display, Plasma Display Panel (PDP), etc. The display 160 may further include a driving circuit, a backlight unit and the like, that may be implemented in a form such as a-si TFT, low temperature poly silicon (LTPS) TFT, an organic TFT (OTFT), and the like. Meanwhile, the display 160 may be implemented as a touch screen that is combined with a touch sensor, a flexible display, a 3D display, and the like.

In addition, the display 160 according to an embodiment may include not only a display panel that outputs an image but also a bezel that houses a display panel. In particular, the bezel according to an embodiment may include a touch sensor (not illustrated) for detecting a user interaction.

The user interface 170 may be implemented as a device such as a button, a touch pad, a mouse or a keyboard, or may be implemented as a touch screen capable of performing the above-described display function and manipulation input function. Here, the button may be various types of buttons such as a mechanical button, a touch pad, a wheel, etc. which are formed on a certain area of the front, side, or rear of the external surface of the main body of the electronic apparatus 100.

The input/output interface 180 may be an interface from among High Definition Multimedia Interface (HDMI), Mobile High-Definition Link (MHL), Universal Serial Bus (USB), Display Port (DP), Thunderbolt, Video Graphics Array (VGA) port, RGB port, D-subminiature (D-SUB), and Digital Visual Interface (DVI).

The input/output interface 180 may input/output at least one of an audio signal or a video signal.

According to an embodiment, the input/output interface 180 may separately include a port for inputting/outputting only an audio signal and a port for inputting/outputting only a video signal, or may be implemented as a single port that inputs/outputs both an audio signal and a video signal. Meanwhile, the electronic apparatus 100 may be implemented as an apparatus that does not include a display, and may transmit an image signal to a separate display apparatus.

Meanwhile, according to an embodiment, the electronic apparatus 100 may further include a tuner and a demodulator.

The tuner (not illustrated) may receive a Radio Frequency (RF) broadcasting signal by tuning a channel selected by a user among RF broadcasting signals received through an antenna or all pre-stored channels.

The demodulator (not illustrated) may receive and demodulate a digital IF signal (DIF) converted by the tuner, and may perform channel decoding, etc.

Figure 9:
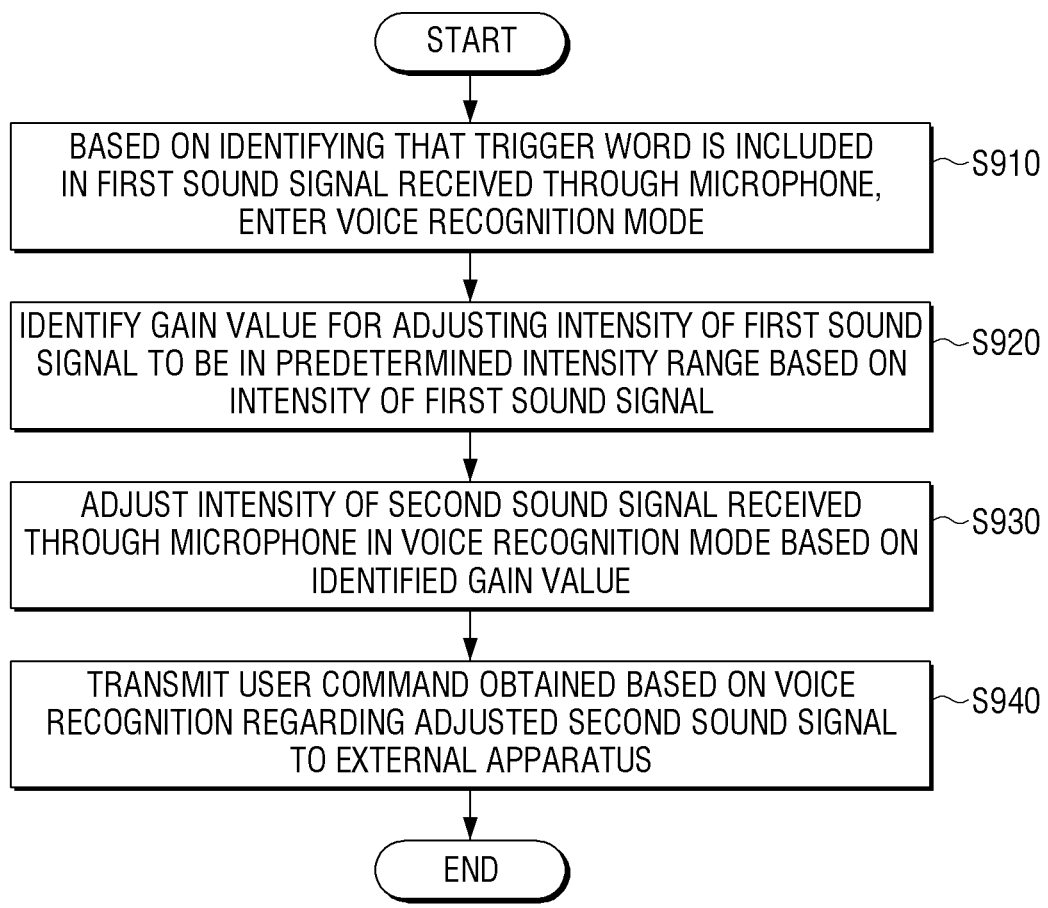
FIG. 9 is a flowchart provided to explain a controlling method of an electronic apparatus according to an embodiment.

FIG. 9 is a flowchart provided to explain a controlling method of an electronic apparatus according to an embodiment.

Referring to FIG. 9, the controlling method of the electronic apparatus according to an embodiment includes, firstly, when it is identified that a trigger word is included in the first sound signal received through a microphone, entering the voice recognition mode (S910).

Subsequently, a gain value for adjusting the intensity of the first sound signal to be in a predetermined intensity range based on the intensity of the first sound signal is identified (S920).

Then, the intensity of the second sound signal received through a microphone in the voice recognition mode is adjusted based on the identified gain value (S930).

Subsequently, a user command obtained based on voice recognition regarding the adjusted second sound signal is transmitted to an external apparatus (S940).

Here, the step S920 of identifying a gain value may include, when the intensity of the first sound signal is equal to or greater than a first threshold value in a specific frequency band, identifying a gain value for decreasing the intensity of the first sound signal to a predetermined intensity and when the intensity of the first sound signal is less than the first threshold value in a specific frequency band, identifying a gain value for increasing the intensity of the first sound signal to a predetermined intensity.

In addition, the step S920 of identifying a gain value may include, when the intensity of the first sound signal exceeds a sound collection band of the microphone for a specific threshold time, identifying a gain value for decreasing the intensity of the first sound signal to a predetermined intensity.

Further, the step S940 of transmitting a user command to the external apparatus may include, transmitting the second sound signal of which intensity is adjusted to an external server that performs voice recognition and transmitting the received user command to the external apparatus.

Here, the controlling method according to an embodiment may include identifying whether the external apparatus is in a turned-on state or in a turned-off state, and the step S940 of transmitting a user command to the external apparatus may include, if it is identified that the external apparatus is in a turned-on state, transmitting a user command to the external apparatus and if it is identified that the external apparatus is in a turned-off state, transmitting a control command for turning on the external apparatus and the user command to the external apparatus.

In addition, the controlling method according to an embodiment may include, if the identified gain value is a gain value for increasing the intensity of the first sound signal, increasing the output volume of the electronic apparatus to correspond to the gain value, and if the identified gain value is a gain value for decreasing the intensity of the first sound signal, decreasing the output volume of the electronic apparatus to the gain value.

The electronic apparatus according to an embodiment stores signal data corresponding to each of a plurality of signals that include a trigger word and have different intensities, and the step S910 of entering the voice recognition mode may include, when the first sound signal corresponds to one of a plurality of signal data, entering the voice recognition mode.

The electronic apparatus according to an embodiment stores a noise extraction algorithm for performing noise filtering and echo canceling, and the step S910 of entering the voice recognition mode may include extracting a noise of the first sound signal using the noise extraction algorithm and then, identifying whether the first sound signal corresponds to one of the plurality of signal data.

In addition, the controlling method according to an embodiment may include re-adjusting a gain value based on a result of comparison between the intensity of the received second signal and the predetermined intensity range.

Here, the electronic apparatus may be a remote controller for controlling the electronic apparatus remotely.

Figure 10:
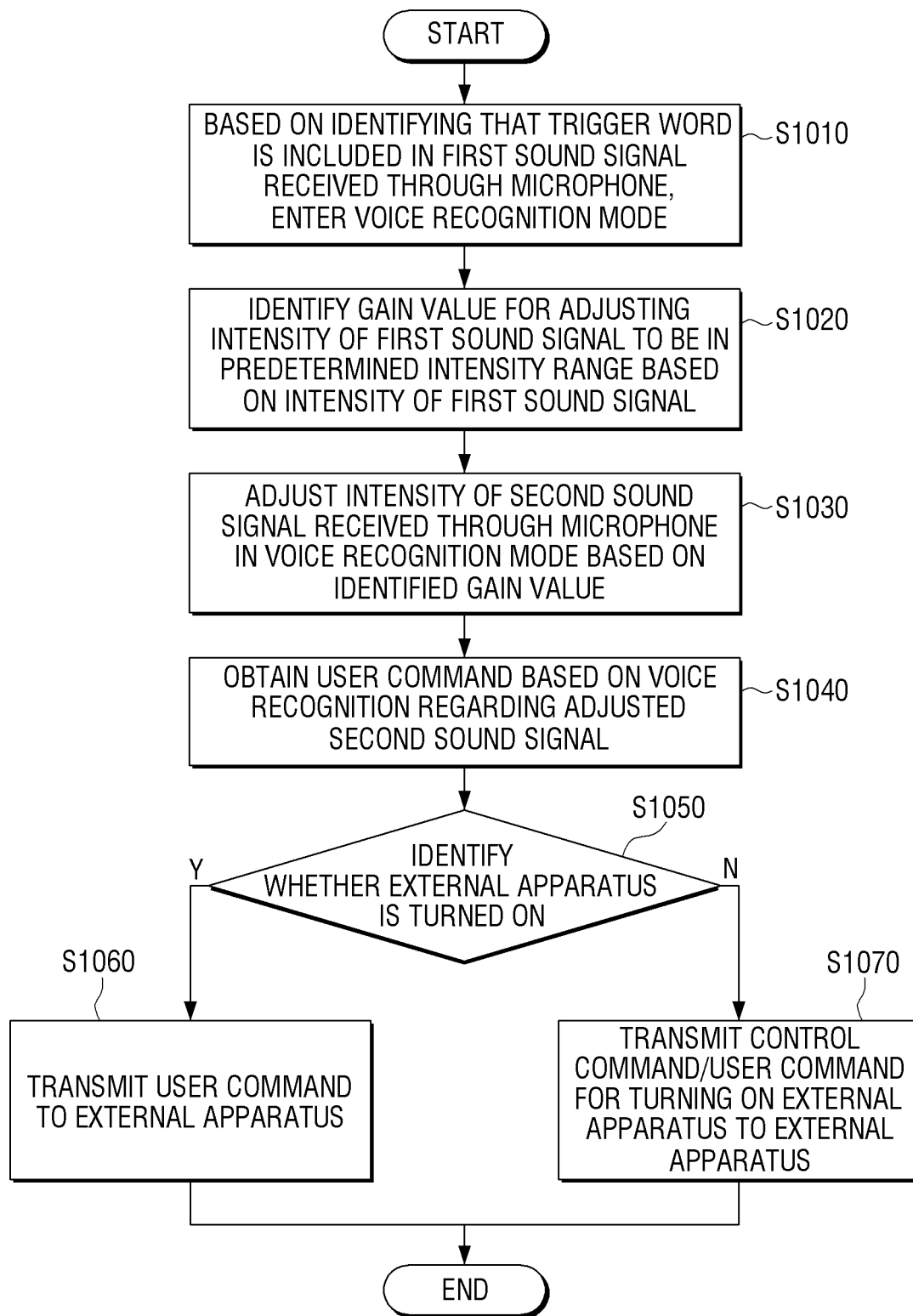
FIG. 10 is a flowchart provided to explain an electronic apparatus that transmits a control command according to an embodiment.

FIG. 10 is a flowchart provided to explain an electronic apparatus that transmits a control command according to an embodiment.

Referring to FIG. 10, the controlling method of the electronic apparatus according to an embodiment includes, when it is identified that the first sound signal received through the microphone includes a trigger word, entering the voice recognition mode (S1010).

Subsequently, the electronic apparatus may identify a gain value for adjusting the intensity of the first sound signal to be in the predetermined intensity range based on the intensity of the first sound signal (S1020).

Then, the electronic apparatus may adjust the intensity of the second sound signal received through the microphone in the voice recognition mode based on the identified gain value (S1030), and obtain a user command based on voice recognition regarding the adjusted second sound signal (S1040). Here, the user command may be a command for controlling an external apparatus.

Subsequently, the controlling method according to an embodiment may include identifying whether the external apparatus is in a turned-on state (S1050). The controlling method according to an embodiment may include, when the external apparatus is in the turned-on state (S1050:Y), transmitting a user command to the external apparatus. In another example, the controlling method may include, when the external apparatus in a turned-off state (S1050:N), transmitting a control command for turning on the external apparatus and a user command to the external apparatus.

The controlling method according to another embodiment may include, when it is identified that a trigger word is included in the first sound signal, entering the voice recognition mode (S1010), and identifying whether the external apparatus is in the turned-on state (S1050). When the external apparatus is in the turned-off state (S1050:N), the controlling method of the electronic apparatus may include transmitting a control command for turning on the external apparatus to the external apparatus.

Meanwhile, FIG. 10 illustrates that the controlling method of the electronic apparatus includes obtaining a user command corresponding to the second sound signal (S1040), but the controlling method of the electronic apparatus according to another embodiment may omit the step S1040, and transmitting the second sound signal of which intensity is adjusted based on the identified gain value in the steps S1060 and S1070 to an external server or an external apparatus. In this case, the external server may obtain a user command corresponding to the second sound signal, or the external apparatus may obtain a user command corresponding to the second sound signal.

Meanwhile, the methods according to the above-described various embodiments may be implemented in the form of an application that can be installed in the existing electronic apparatus.

In addition, the methods according to the above-described various embodiments may be implemented merely by software upgrade or hardware upgrade of the existing electronic apparatus.

Further, the above-described various embodiments may be performed through an embedded server provided in the electronic apparatus or at least one external server of the electronic apparatus or the display apparatus.

Meanwhile, according to an embodiment, the above-described various embodiments of the disclosure may be implemented as software including instructions that can be stored in machine-readable storage media, which can be read by machine (e.g.: computers). The machine refers to an apparatus that calls instructions stored in a storage medium, and can operate according to the called instructions, and the apparatus may include an electronic apparatus (e.g.: an electronic apparatus (A)) according to the embodiments described in the disclosure. When an instruction is executed by a processor, the processor may perform a function corresponding to the instruction by itself, or by using other components under its control. The instruction may include a code that is generated or executed by a compiler or an interpreter. The storage medium that is readable by machine may be provided in the form of a non-transitory storage medium. Here, the term 'non-transitory' only means that a storage medium does not include signals, and is tangible, but does not indicate whether data is stored in the storage medium semi-permanently or temporarily.

In addition, according to an embodiment of the disclosure, the method according to the various embodiments described above may be provided while being included in a computer program product. A computer program product refers to a product, and it can be traded between a seller and a buyer. The computer program product can be distributed on-line in the form of a storage medium that is readable by machines (e.g.: a compact disc read only memory (CD-ROM)), or through an application store (e.g.: Play Store™). In the case of on-line distribution, at least a portion of the computer program product may be stored in a storage medium such as the server of the manufacturer, the server of the application store, and the memory of the relay server at least temporarily, or may be generated temporarily.

Also, each of the components according to the aforementioned various embodiments (e.g.: a module or a program) may consist of a singular object or a plurality of objects. In addition, among the aforementioned corresponding sub components, some sub components may be omitted, or other sub components may be further included in the various embodiments. Generally or additionally, some components (e.g.: a module or a program) may be integrated as an object, and perform the functions that were performed by each of the components before integration identically or in a similar manner Operations performed by a module, a program, or other components according to the various embodiments may be executed sequentially, in parallel, repetitively, or heuristically. Or, at least some of the operations may be executed in a different order, or omitted, or other operations may be added.

While preferred embodiments of the disclosure have been shown and described, the disclosure is not limited to the aforementioned specific embodiments, and it is apparent that various modifications can be made by those having ordinary skill in the art to which the disclosure belongs, without departing from the gist of the disclosure as claimed by the appended claims, and such modifications are not to be interpreted independently from the technical idea or prospect of the disclosure.

What is claimed is:

1. An electronic apparatus comprising:
    a microphone;
    a communication interface including circuitry; and
    at least one processor configured to:
        based on identifying that a trigger word is included in a first sound signal received through the microphone, enter a voice recognition mode;
        identify a gain value based on a result of comparison between an intensity of the first sound signal and a predetermined intensity range;
        adjust an intensity of a second sound signal received through the microphone in the voice recognition mode based on the identified gain value;
        obtain a user command based on voice recognition regarding the adjusted second sound signal;
        identify whether an external apparatus is in a turned-on state or in a turned-off state through the communication interface;
        based on identifying that the external apparatus is in the turned-on state, transmit the user command to the external apparatus; and
        based on identifying that the external apparatus is in the turned-off state, transmit a control command for turning on the external apparatus and the user command to the external apparatus.

2. The electronic apparatus as claimed in claim 1, wherein the at least one processor is configured to:
    based on the intensity of the first sound signal being equal to or greater than a first threshold value in a specific frequency band, identify the gain value for decreasing the intensity of the second sound signal to the predetermined intensity; and
    based on the intensity of the first sound signal being less than the first threshold value in the specific frequency band, identify the gain value for increasing the intensity of the second sound signal to the predetermined intensity.

3. The electronic apparatus as claimed in claim 1, wherein the at least one processor is configured to, based on the intensity of the first sound signal exceeding a sound collection band of the microphone for a specific threshold period, identify the gain value for decreasing the intensity of the second sound signal to the predetermined intensity.

4. The electronic apparatus as claimed in claim 1, wherein the at least one processor is configured to control the communication interface to transmit the second sound signal whose intensity is adjusted to an external server that performs voice recognition, and control the communication interface to transmit the received user command to the external apparatus.

5. The electronic apparatus as claimed in claim 1, comprising:
    a speaker,
    wherein the at least one processor is configured to:
        based on the identified gain value being a gain value for increasing the intensity of the second sound signal, increase an output volume of the speaker to correspond to the gain value; and
        based on the identified gain value being a gain value for decreasing the intensity of the second sound signal, decrease the output volume of the speaker to correspond to the gain value.

6. The electronic apparatus as claimed in claim 1, comprising:
    a storage including the trigger word and storing signal data corresponding to a plurality of signals of different intensities, respectively,
    wherein the at least one processor is configured to, based on the first sound signal corresponding to one of the plurality of signal data stored in the storage, enter the voice recognition mode.

7. The electronic apparatus as claimed in claim 6, wherein the storage is configured to store a noise extraction algorithm for performing noise filtering and echo canceling, and
    wherein the at least one processor is configured to, after extracting a noise of the first sound signal using the noise extraction algorithm, identify whether the first sound signal corresponds to one of the plurality of signal data.

8. The electronic apparatus as claimed in claim 1, wherein the at least one processor is configured to re-adjust the gain value based on a result of comparison between the intensity of the received second sound signal and the predetermined intensity range.

9. The electronic apparatus as claimed in claim 1, wherein the electronic apparatus is a remote control device for controlling the external apparatus remotely.

10. A controlling method of an electronic apparatus, comprising:
    based on identifying that a trigger word is included in a first sound signal received through the microphone, entering a voice recognition mode;
    identifying a gain value based on a result of comparison between an intensity of the first sound signal and a predetermined intensity range;
    adjusting an intensity of a second sound signal received through the microphone in the voice recognition mode based on the identified gain value;

obtaining a user command based on voice recognition regarding the adjusted second sound signal;

identifying whether an external apparatus is in a turned-on state or in a turned-off state;

based on identifying that the external apparatus is in the turned-on state, transmitting the user command to the external apparatus; and based on identifying that the external apparatus is in the turned-off state, transmitting a control command for turning on the external apparatus and the user command to the external apparatus.

11. The controlling method as claimed in claim 10, wherein the identifying a gain value comprises:

based on the intensity of the first sound signal being equal to or greater than a first threshold value in a specific frequency band, identifying the gain value for decreasing the intensity of the second sound signal to the predetermined intensity; and based on the intensity of the first sound signal being less than the first threshold value in the specific frequency band, identifying the gain value for increasing the intensity of the second sound signal to the predetermined intensity.

12. The controlling method as claimed in claim 10, wherein the identifying a gain value comprises, based on the intensity of the first sound signal exceeding a sound collection band of the microphone for a specific threshold period, identifying the gain value for decreasing the intensity of the second sound signal to the predetermined intensity.

13. The controlling method as claimed in claim 10, wherein the transmitting the user command to the external apparatus comprises:

transmitting the second sound signal whose intensity is adjusted to an external server that performs voice recognition; and transmitting the received user command to the external apparatus.

\* \* \* \* \*